United States Patent [19]

Egawa

[11] Patent Number: 4,679,871
[45] Date of Patent: Jul. 14, 1987

[54] IC PACKAGE CONNECTOR

[75] Inventor: Yoshinori Egawa, Hachiohji, Japan

[73] Assignee: Yamaichi Electric Mfg. Co., Ltd., Tokyo, Japan

[21] Appl. No.: 841,457

[22] Filed: Mar. 19, 1986

[30] Foreign Application Priority Data

Mar. 22, 1985 [JP] Japan .............................. 60-41858[U]

[51] Int. Cl.⁴ ............................................ H01R 23/72
[52] U.S. Cl. ......................................... 439/70; 439/72
[58] Field of Search ........... 339/17 CF, 17 M, 176 M, 339/176 MP

[56] References Cited

U.S. PATENT DOCUMENTS 4,037,270 7/1977 Ahmann et al. ................ 339/17 CF
4,538,864 9/1985 Ichimura ......................... 339/17 CF

FOREIGN PATENT DOCUMENTS 53-41979 4/1978 Japan .
59-58850 4/1984 Japan .

Primary Examiner—Neil Abrams
Attorney, Agent, or Firm—Wenderoth, Lind & Ponack

[57] ABSTRACT

A connector for an IC package has a connector body, an IC package accommodation compartment formed in the connector body, a peripheral wall defining the compartment, and a plurality of partition walls projecting from the inside surface of the peripheral wall toward the compartment at regular intervals and extending from the upper surface of the peripheral wall toward the bottom of the compartment to define contact accommodation grooves. A plurality of contacts corresponding in number to IC leads of the IC package are accommodated within the grooves and are isolated from one another by the partition walls. Each contact is formed of a resilient contact piece having a planted part implanted in the connector body, a male terminal projecting from the bottom of the connector body and a leading part rising from the printed part and slanting toward the compartment. The leading part has an engaging part bent toward the compartment and is resiliently displaced in a direction away from the compartment by a bent part of the IC lead when the IC package is inserted into the compartment. When the IC package has been set in position relative to the connector body, the leading part is returned toward its original position while still having a resilient force biasing itself to its original position. The engaging part remains in resilient contact with the IC lead at a shoulder part of the IC lead.

4 Claims, 5 Drawing Figures 4,679,871

IC PACKAGE CONNECTOR

BACKGROUND OF THE INVENTION

1. Field of the Invention

The present invention relates to a connector for an IC package having a plurality of IC leads arranged in order along the side surface thereof.

2. Description of the Prior Art

There are various types of IC packages. For example, an IC package having a plurality of IC leads arranged in order and each comprising a shoulder part projecting sideways from the side surface of the IC package body and a bent portion extending downwardly from the shoulder part along the side surface of the package body, thereby forming a substantially L-shaped profile as a whole, has been put to practical use. Further, an IC package having a plurality of IC leads arranged in order and each comprising a shoulder part, a bent part and a leading part folded back in a U-shape to the bottom of the package body, thereby forming a substantially J-shaped profile as a whole is called a J-bend type IC package. When such an IC package is placed on a printed board, for example, a connector having a plurality of contacts is used as disclosed in Japanese Patent Public Disclosures No. SHO 53-41979 and No. SHO 59-58850, for example. In such related art, electrical contact is obtained by resiliently pressing the contacts against the outer sides of the IC leads and the IC package is retained by frictional contact between the contacts and the IC leads. Since the retention of the IC package relies merely on the frictional contact, there has been a fair possibility of the IC package being incompletely set in position relative to the connector which gives rise to floating or detachment of the IC leads from the connector due to external vibration or impact. Thus, there has been encountered the serious problem of reliability in electrical contact between the IC package and the connector.

SUMMARY OF THE INVENTION

The main object of the present invention is to provide a connector for an IC package of a J-bend type or similar type, which is capable of attaining reliable electrical contact between contacts of the connector and IC leads of the IC package, maintaining a state of reliable electrical contact and completely retaining the IC package on the connector by cooperation of the contacts and the IC leads.

To achieve the object described above, according to the present invention, there is provided a connector for an IC package which comprises a connector body, an IC package accommodation compartment formed in the connector body, a peripheral wall defining the compartment, a plurality of partition walls projecting from the inside surface of the peripheral wall toward the compartment at regular intervals and extending from the upper surface of the peripheral wall in the direction of the depth of the compartment to define contact accommodation grooves, and a plurality of contacts corresponding in number to IC leads of the IC package, accommodated within the grooves, isolated from one another by the partition walls and each formed of a resilient contact piece comprising a planted part implanted in the connector body, a male terminal projecting from the bottom of the connector body and a leading part rising from the planted part and slanting toward the compartment and having an engaging part bent toward the compartment and being resiliently displaced in a direction away from the compartment by a bent part of the IC lead when the IC package is inserted into the compartment and, when the IC package has been set in position relative to the connector body, being returned toward its original position while still having a force of restoring itself to its original position remaining and resiliently contacting the IC lead by engagement between the engaging part of the resilient contact piece and a shoulder part of the IC lead.

The above and other objects, characteristic features and advantages of the present invention will become more apparent to those skilled in the art as the disclosure is made in the following description of preferred embodiments of the invention, as illustrated in the accompanying drawings.

DESCRIPTION OF THE PREFERRED EMBODIMENTS

The present invention will now be described in detail with reference to the illustrated embodiments.

Figure 1:
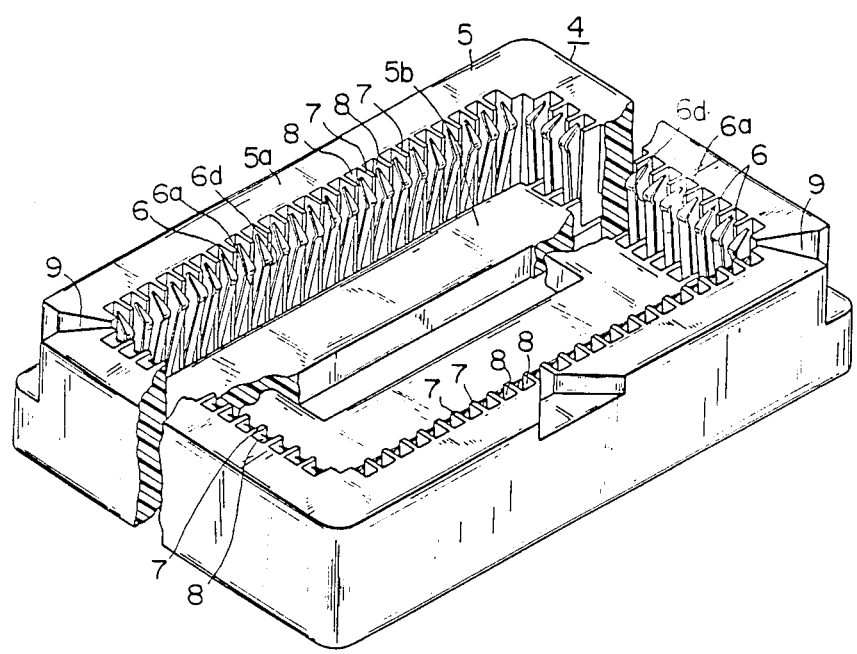
FIG. 1 is a partially cutaway perspective view illustrating one embodiment of the IC package connector according to the present invention.
Figure 2A:
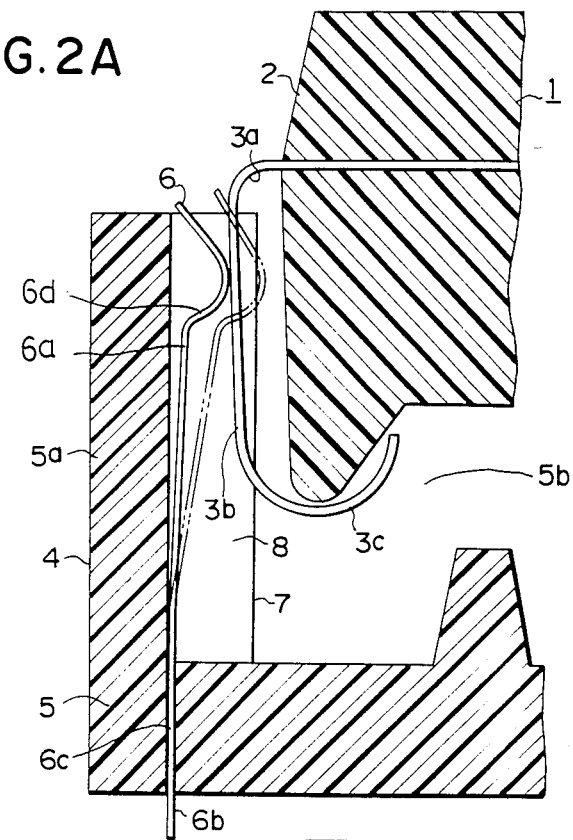
FIG. 2A is an enlarged partial cross sectional view of the present invention showing a state of contact between a contact of the IC package connector and an IC lead of an IC package when the IC package is being set in position relative to the IC package connector.
Figure 2B:
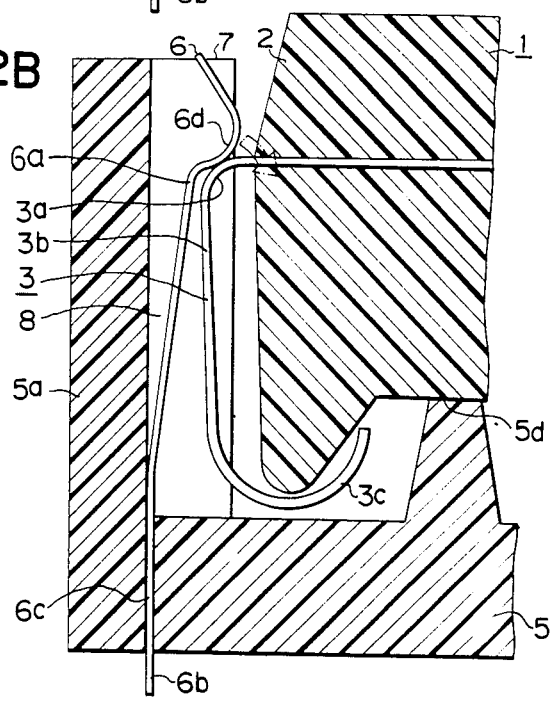
FIG. 2B is an enlarged partial cross sectional view of the present invention showing a state of contact assumed when the IC package has been set in position relative to the IC package connector.

FIGS. 1, 2A and 2B illustrate one embodiment of an IC package connector 4 according to the present invention. In FIG. 2A, reference numeral 1 denotes a so-called J-bend type IC package and numeral 2 designates a package body comprising a square insulation substrate having an integrated circuit provided therein. The package body 2 of the IC package 1 is provided on each of its four sides with a plurality of IC leads 3 arranged in alignment with one another at regular intervals. Each of the IC leads 3 comprises a shoulder part 3a slightly projecting sideways from the side surface of the package body 2, a bent part 3b extending downwardly from the shoulder part 3a along the side surface of the package body 2, and a leading part 3c folded back in a U-shape to the bottom surface of the package body. Reference numeral 4 denotes a connector for the IC package 1 and numeral 5 designates a connector body having a peripheral wall 5a which defines an IC package accommodation compartment 5b. The IC package is accommodated within the compartment 5b of the IC package connector so that the IC leads 3 face the inside surfaces of the peripheral wall 5a of the connector body 5.

Referring to FIG. 1, the peripheral wall 5a of the connector body 5 is provided on each of the inside surfaces thereof with a plurality of partition walls 7 projecting inwardly, and extending from the upper surface of the peripheral wall 5a toward the bottom of the compartment 5b and arranged in alignment with one another along the inside surface at regular intervals. The adjacent partition walls 7 define contact accommodation grooves 8 having accommodated therein contacts 6 corresponding in number to the IC leads 3 of the IC package and being brought into contact with the IC leads 3. The contacts 6 are thus isolated from one another by the partition walls 7. A pair of diagonal corners of the peripheral wall 5a of the connector body 5 are partially cut off to form tool insertion grooves 9.

Returning to FIG. 2A showing the state wherein the IC package 1 is being set in position relative to the IC package connector 4, the contact 6 is formed of a resilient platelike contact piece 6a comprising a planted part 6c implanted in the connector body 5, a male terminal 6b projecting downwardly from the bottom of the connector body 5 and a leading part having an engaging part 6d being brought into collision engagement with the IC lead 3 of the IC package 1. The leading part of the contact piece 6a extends upwardly from the side of the leading part 3c of the IC lead 3 toward the side of the shoulder part 3a of the IC lead 3 as interposed between the inside surface of the peripheral wall 5a and the side surface of the IC package 1, and is capable of being resiliently displaced to be close to and apart from the side surface of the IC package 1 with the planted part 6c as a fulcrum.

To be specific, the leading part having the engaging part 6d of the contact piece 6a extends upwardly and slants toward the IC package accommodation compartment 5b and has its upper portion curved toward the compartment 5b to form the aforementioned engaging part 6d. When the IC package 1 is inserted from above into the compartment 5b of the connector 4, as illustrated in FIG. 2A, the outer surface of the bent part 3b of the IC lead 3 urges the engaging part 6d of the resilient contact piece 6a in a direction outward from the compartment 5b against the resiliency of the contact piece 6a and the lead 3 is held in contact with the engaging part 6d. As the insertion of the IC package 1 proceeds, the engaging part 6d of the contact piece 6a and the bent part 3b of the IC lead 3 slide relative to each other and, when the bottom of the IC package body 2 is supported on a support wall 5d formed on the inside bottom of the compartment 5b of the connector body 5 as illustrated in FIG. 2B, the engaging part 6d of the contact piece 6a reaches the shoulder part 3a of the IC lead 3 and is restored to a position that is just spaced slightly outward from the compartment relative to its original position before insertion of the IC package. That is to say, the engaging part 6d of the contact piece 6a engages the shoulder part 3a of the IC lead 3 while it still has a resilient force to restore it to its original position as shown by the arrow in FIG. 2B. Therefore, the engagement between the engaging part 6d of the contact 3 and the shoulder part 3a of the IC lead 3 constitutes an electrical connection between the IC package and the connector that prevents the IC package from being detached accidentally from the connector.

Figure 3:
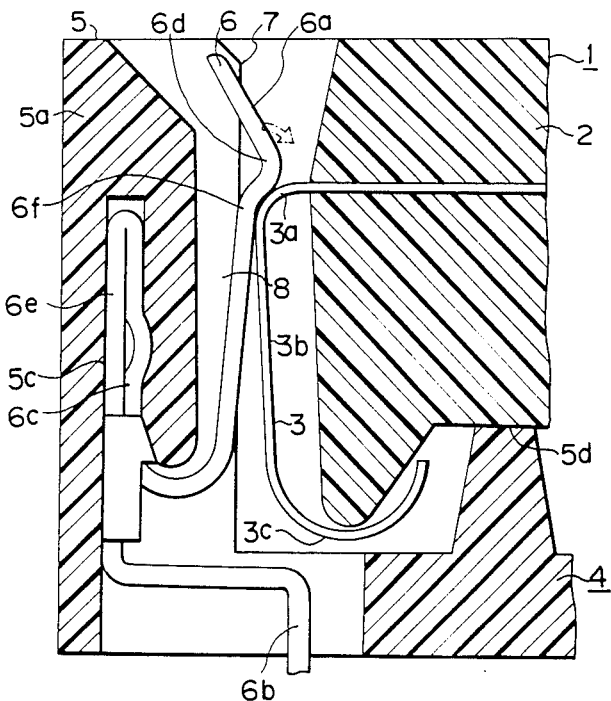
FIG. 3 is an enlarged partial cross sectional view illustrating another embodiment of the IC package connector according to the present invention and showing a state of contact between a contact of the IC package connector and the IC lead of the IC package when the IC package has been set in position relative to the IC package connector.

FIG. 3 illustrates another embodiment of the IC package connector 4 according to the present invention. In this embodiment, the peripheral wall 5a of the connector body 5 has formed therein a plurality of longitudinal grooves 5c for implanting the contacts 6 therein. Each of the contacts has a resilient platelike contact piece 6a. The contact piece 6a comprises a planted part 6c which constitutes a folded part 6e formed by folding the contact piece in half and inserting it under pressure into the longitudinal implantation groove 5c from the lower open end thereof, a male terminal 6b extending from the folded part 6e and projecting downwardly from the bottom of the connector body 5, a leading part having a first engaging part 6d being brought into engagement with the shoulder part 3a of the IC lead 3 provided in the body 2 of the IC package 1, and also having a second engaging part 6f being brought into engagement with a portion of the bent part 3b of the IC lead immediately below the shoulder part 3a. The leading part of the contact piece 6a in this embodiment extends upwardly from the lower open end of the groove 5c and slants toward the package body 2 similar to the preceding embodiment and is curved at its upper portion to form the aforementioned first and second engaging parts 6d and 6f. In this embodiment, the leading part of the contact piece 6a is urged in a direction away from the package body 2 against its own resiliency by the IC lead 3 as the IC package 1 is inserted into the accommodation compartment 5b of the body 5 of the connector 4 and is restored to a position at which the second engaging part 6f of the contact 6 engages the IC lead 3 while it still has a resilient force of restoring itself to its original position as shown by the arrow in FIG. 3 when the IC package 1 has been set in position with the bottom of the package body 2 supported on the support wall 5d of the connector body 5. The electrical connection between the IC package 1 and the connector 4 can be secured by the contact or engagement between the second engaging part 6f of the contact 6 and the IC lead 3. The first engaging part 6d of the contact 6 can also serve to prevent the IC package 1 from rising by its engagement with the shoulder part 3a of the IC lead 3.

With the construction of this embodiment as described above, it is possible to completely eliminate a possibility of inferior contact between the engaging part 6d of the contact 6 and the shoulder part 3a of the IC lead 3 in the preceding embodiment, which possibility may result from an error in manufacturing a multiplicity of contacts 6.

Figure 4:
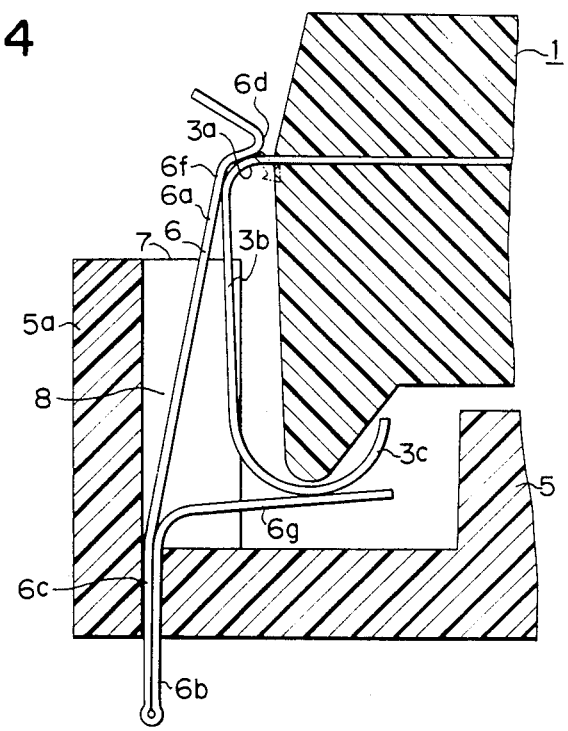
FIG. 4 is an enlarged partial cross sectional view illustrating still another embodiment of the IC package connector according to the present invention and showing a state of contact between a contact of the IC package connector and the IC lead of the IC package assumed when the IC package has been set in position relative to the IC package connector.

FIG. 4 illustrates still another embodiment of the IC package connector according to the present invention. In this embodiment, a resilient platelike contact piece 6a of a contact 6 is folded in half so that the folded portion thereof is comprised of a planted part 6c implanted in the connector body 5, a male terminal 6b projecting downwardly from the bottom of the connector body 5 and a remaining portion thereof that is bifurcated. One of the branches formed by the bifurcation extends upward and slants toward the IC package accommodation compartment 5b and has a first engaging part 6d and a second engaging part 6f formed similarly to the second embodiment shown in FIG. 3. The other branch extends sideways to constitute a support part 6g for supporting thereon the folded-back U-shaped leading part 3c of the IC lead 3. With the structure of this embodiment, therefore, there are three portions of contact between the contact 6 and the IC lead 3, i.e. one between the first engaging part 6d and the shouler part 3a, another between the second engaging part 6f and the bent part 3b and the remaining one between the support part 6g and the U-shaped leading part 3c. In addition, a restoring force of the contact piece 6a is exerted at the first engaging part 6d onto the shoulder part 3a of the IC lead 3 to urge the IC package 1 in the downward direction as indicated by the arrow in FIG. 4, whereas another restoring force of the contact piece 6a is exerted at the support part 6g onto the U-shaped leading part 3c of the IC lead 3 to urge the IC package 1 in the upward direction against the aforementioned downward force. Thus, the IC package 1 is set in position relative to the connector body 5 in a firmly engaged and resiliently retained state. Since the support part 6g of the contact 6 serves not only to support the U-shaped leading part 3c of the IC lead 3 but also to act as means for electrical contact with the IC lead 3, reliability of contact between the contact 6 and the IC lead 3 is further enhanced.

The IC package 1 resiliently retained within the IC package accommodation compartment 5b of the IC package connector 4 can be detached from the connector by the use of a tool (not shown) which is inserted through the tool insertion grooves 9 as shown in FIG. 1.

According to the present invention, as described above, since the contacts of the IC package connector are resiliently displaced in a direction outward from the IC package accommodation compartment during the course of the insertion of an IC package into the compartment and, upon reaching the shoulder parts of the IC leads, are returned toward their original positions due to their own resiliency, they can be brought into engagement with the IC leads. Furthermore, since the IC leads have the shoulder parts having an L-shaped profile and exhibiting high strength, the contacts of the connector can be engaged with the IC leads with higher exactitude. Thus, the present invention provides a connector that reliably retains an IC package by the cooperation of the contacts and the IC leads, effectively prevents the IC package from accidental floating or detachment due to external vibration and impact, attains a reliable electrical contact between the contacts and the IC leads, and maintains the reliable electrical contact.

What is claimed is:

1. A connector for an IC package, the IC package having a body provided with a plurality of IC leads each of which has an arcuate shoulder part extending from a side of the body and a respective bent part extending from the shoulder part toward the bottom of the body, said connector comprising:

a connector body having a bottom wall and a peripheral sidewall extending upward from the bottom wall and around the periphery thereof to bound a compartment in which the IC package is inserted with the shoulder part of each of the IC leads projecting toward said peripheral side wall and the bent part of each of the IC leads extending from the shoulder part toward the bottom wall of said connector body, and a plurality of partition walls spaced at regular intervals along the inner periphery of said sidewall and projecting therefrom into the compartment, each of said partition walls extending between the upper end of the peripheral sidewall and said bottom wall thereby defining a plurality of contact accommodation grooves between said plurality of partition walls; and a plurality of electrical contacts each of which extends in a respective one of said accommodation grooves, each of said contacts comprising a planted part fixed to said connector body having an end in said respective accommodation groove that is adjacent said bottom wall and said peripheral sidewall of said connector body and having a terminal portion that is outside of said connector body and, a flat resilient contact piece extending at one end thereof from said end of said planted part into said compartment toward the center thereof and at an angle relative to said peripheral sidewall, said contact piece having at the other end thereof an engaging part for engaging the shoulder part of the IC lead at one location thereon when the IC package is inserted in said compartment, and another engaging part extending from said first mentioned engaging part at an angle therefrom toward the center of said compartment for engaging the shoulder part at another location spaced from said first-mentioned location when said IC package is inserted in said compartment, said resilient contact piece being urged by the bent part of an IC lead of the IC package to deflect about said end of said planted part toward the peripheral side wall as the IC package is inserted into said compartment and to deflect under its own resiliently toward the center of said compartment after the IC package is inserted in the compartment such that said engaging parts engage the shoulder part of the IC lead at the two respective said locations thereon.

2. A connector as claimed in claim 1,
wherein said bottom wall has a support wall integral therewith and extending therefrom into the compartment for solely supporting the IC package in the compartment along the body of the IC package when the IC package is inserted into said compartment.

3. A connector as claimed in claim 1,
wherein said planted part comprises two overlapping planted part portions engaging each other, said end of said planted part being part of one of said two overlapping portions and said terminal portion that extends outside of said connector body being part of the other of said two overlapping portions.

4. A connector as claimed in claim 1,
wherein said planted part comprises two overlapping planted part portions engaging one another a portion of which is said terminal portion that is outside of said connector body, said end of said planted part is part of one of said overlapping planted part portions, and the other of said planted part portions extends within said compartment toward the center thereof to engage the bent part of the respective IC lead when the IC package is inserted in the compartment.

* * * * *